United States Patent
Qin

(10) Patent No.: US 10,153,304 B2
(45) Date of Patent: Dec. 11, 2018

(54) THIN FILM TRANSISTORS, ARRAYS SUBSTRATES, AND MANUFACTURING METHODS

(71) Applicant: Wuhan China Star Optoelectronics Technology Co., Ltd., Wuhan, Hubei (CN)

(72) Inventor: Fang Qin, Guangdong (CN)

(73) Assignee: Wuhan China Star Optoelectronics Technology Co., Ltd, Wuhan, Hunei (CN)

( * ) Notice: Subject to any disclaimer, the term of this patent is extended or adjusted under 35 U.S.C. 154(b) by 168 days.

(21) Appl. No.: 15/305,082

(22) PCT Filed: Jul. 20, 2016

(86) PCT No.: PCT/CN2016/090610
§ 371 (c)(1),
(2) Date: Oct. 18, 2016

(87) PCT Pub. No.: WO2018/006441
PCT Pub. Date: Jan. 11, 2018

(65) Prior Publication Data
US 2018/0182783 A1    Jun. 28, 2018

(30) Foreign Application Priority Data

Jul. 8, 2016  (CN) .......................... 2016 1 0538743

(51) Int. Cl.
*H01L 27/12* (2006.01)
*H01L 29/786* (2006.01)
(Continued)

(52) U.S. Cl.
CPC ...... *H01L 27/1225* (2013.01); *H01L 23/3171* (2013.01); *H01L 27/12* (2013.01);
(Continued)

(58) Field of Classification Search
None
See application file for complete search history.

(56) References Cited

U.S. PATENT DOCUMENTS 8,058,645 B2 *  11/2011  Jeong ................. H01L 29/7869
                                                    257/43
8,890,159 B2 *  11/2014  Yamazaki ............ H01L 29/247
                                                    257/43
2016/0027814 A1 *  1/2016  Jin ..................... H01L 27/1255
                                                    257/296

* cited by examiner

*Primary Examiner* — Sue A Purvis
*Assistant Examiner* — Jordan Klein
(74) *Attorney, Agent, or Firm* — Andrew C. Cheng

(57) ABSTRACT

The present disclosure relates to a TFT includes an active layer formed on a substrate, wherein the active layer includes a first semiconductor layer and a second semiconductor layer stacked together. The first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%. The present disclosure also includes an array substrate having the TFT and the manufacturing method thereof. The array substrate may be adopted in LCD or OLED. The TFT adopts two layers of IGZO semiconductor materials to be the semiconductor of the active layer. Not only the demand toward the TFT characteristics may be satisfied, but also the carrier mobility rate of the IGZO active layer may be enhanced.

10 Claims, 2 Drawing Sheets

(51) Int. Cl.
   *H01L 29/06* (2006.01)
   *H01L 29/24* (2006.01)
   *H01L 23/31* (2006.01)
(52) U.S. Cl.
   CPC .......... *H01L 27/1288* (2013.01); *H01L 29/06* (2013.01); *H01L 29/24* (2013.01); *H01L 29/786* (2013.01); *H01L 29/7869* (2013.01)

THIN FILM TRANSISTORS, ARRAYS SUBSTRATES, AND MANUFACTURING METHODS

BACKGROUND OF THE INVENTION

1. Field of the Invention

The present disclosure relates to liquid crystal display technology, and more particularly to a thin film transistor (TFT), an array substrate having the TFT, and the manufacturing method of the TFTs.

2. Discussion of the Related Art

Flat display devices are characterized by attributes such as thinner, power-saving, and low radiation, and thus are greatly adopted. Currently, flat display devices mainly include liquid crystal displays (LCDs) and organic light emitting displays (OLEDs). It is known that the TFT is a key component of the flat display devices, which may be formed on a glass substrate or a plastic substrate. The TFT operates as a lighting device or a driving device on the LCDs or the OLEDs.

With respect to the display panel technology, along with the middle-large scale, the demand toward high resolution has been increased. Also, higher requirement toward the charge and discharge of semiconductor devices on the active layer has been proposed. Indium gallium zinc oxide (IGZO) is zinc amorphous oxide containing indium, gallium and zinc, which has a high mobility, and the carrier mobility rate is 20 to 30 times that of amorphous silicon. As such, the IGZO can greatly improve the charge and discharge rate of the pixel electrode. In addition, the IGZO is characterized by attributes such as high on-state current and low off-state current (which can be quickly switched) such that the response rate of pixels and the refresh rate may be enhanced. At the same time, the faster response can also greatly improve the row scanning rate, such that ultra-high resolution may be realized in the display panel.

By adding the In atom, the carrier mobility of the IGZO may be enhanced. However, when the IGZO is adopted as the semiconductor body of the active layer of the TFT and when the content of the In atom is increased, the semiconductor body may become a conductor, which cannot satisfy the requirement. Thus, it is critical to satisfy the demand with respect to the characteristics of the TFT and to enhance the carrier mobility of the IGZO at the same time.

SUMMARY

The present disclosure relates to a TFT, wherein the IGZO is adopted to generate the semiconductor of the active layer. The proposed TFT not only can satisfy the demand with respect to the characteristics of the TFT, but also can enhance the carrier mobility of the IGZO.

In one aspect, a thin film transistor (TFT) includes: an active layer formed on a substrate, wherein the active layer includes a first semiconductor layer and a second semiconductor layer stacked together, the first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%.

Wherein the first semiconductor layer is made by IGZO having the atomic ratio In/(Ga+Zn) in a range from 40 to 50%.

Wherein the second semiconductor layer is made by IGZO having the atomic ratio In/(Ga+Zn) in a range from 55 to 60%.

Wherein an oxygen protection layer covers the second semiconductor layer.

Wherein the TFT further includes a gate electrode, a source electrode, and a drain electrode, wherein a buffer layer is formed on the substrate, the first semiconductor layer and the second semiconductor layer are formed on the buffer layer in sequence, a gate insulation layer and the gate electrode are formed on the active layer in sequence, an insulation dielectric layer is arranged on the gate electrode, and the insulation dielectric layer covers the substrate, the source electrode and the drain electrode are formed on the insulation dielectric layer, and the source electrode and the drain electrode respectively connects to the active layer via at least one through hole within the insulation dielectric layer.

Wherein the oxygen protection layer covers a middle area of the active layer, and the active layer is exposed by two sides of the oxygen protection layer; the exposed first semiconductor layer and the second semiconductor layer of the active layer are transformed into conductors by applying an ion injection process or a plasma bombard process, wherein one end is formed as a source connection portion, and the other end is formed as a drain connection portion, the source electrode connects to the source connection portion via the through hole configured within the insulation dielectric layer, and the drain electrode connects to the drain connection portion via the through hole configured within the insulation dielectric layer.

In one aspect, the TFT array substrate includes a glass substrate and the above TFT arranged on the glass substrate.

In another aspect, a manufacturing method of TFT array substrates includes: S1: providing a glass substrate and forming a buffer layer on the glass substrate; S2: forming a first semiconductor layer and a second semiconductor layer on the buffer layer in sequence, wherein the active layer includes a first semiconductor layer and a second semiconductor layer stacked together, the first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%; S3: adopting a first masking process to etch the first semiconductor layer and the second semiconductor layer to form the patterned active layer, the active layer includes the first semiconductor layer and the second semiconductor layer stacked in sequence; S4: forming a gate insulation layer and a gate electrode layer on the glass substrate having the active layer in sequence; S5: adopting a second masking process to etch the gate insulation layer and the gate electrode layer to form the patterned gate insulation layer and gate electrode; S6: forming an insulation dielectric layer on the gate electrode, and covering the glass substrate by the insulation dielectric layer; S7: adopting a third masking process to form a through hole within the insulation dielectric layer; S8: forming a metallic conductive layer on the insulation dielectric layer; S9: adopting a fourth masking process to etch the metallic conductive layer to form a patterned source electrode and a patterned drain electrode, the source electrode and the drain electrode respectively connects to the active layer via the through hole within the insulation dielectric layer.

Wherein the first semiconductor layer is made by IGZO having the atomic ratio In/(Ga+Zn) in a range from 40 to 50%.

Wherein the second semiconductor layer is made by IGZO having the atomic ratio In/(Ga+Zn) in a range from 55 to 60%.

Wherein the step S2 further includes covering the second semiconductor layer by an oxygen protection layer.

Wherein the step S5 further includes: Step S51: adopting a top gate self-aligned process to perform an etching process to form the gate insulation layer and the gate electrode; Step S52: adopting an ion injection process or a plasma bombard process to transform two ends of the first semiconductor layer and the second semiconductor layer to be conductors, wherein one end is formed as a source connection portion, and the other end is formed as a drain connection portion.

In view of the above, two semiconductor layers made by IGZO are formed as the semiconductor body of the active layer. The IGZO semiconductor layer, i.e., the second semiconductor layer 132, having the greater content of the In atom is configured to be closer to the GI layer than the IGZO semiconductor layer having fewer content of the In atom. In this way, the semiconductor body of the active layer may be prevented from being bombarded by the ionomer so as to enhance the carrier mobility rate of the active layer. In addition, the IGZO semiconductor layer having fewer content of the In atom is configured to prevent the semiconductor body of the active layer from being transformed into the conductor so as to satisfy the demand toward the TFT characteristics.

DETAILED DESCRIPTION OF THE EMBODIMENTS

Embodiments of the invention will now be described more fully hereinafter with reference to the accompanying drawings, in which embodiments of the invention are shown.

Figure 1:
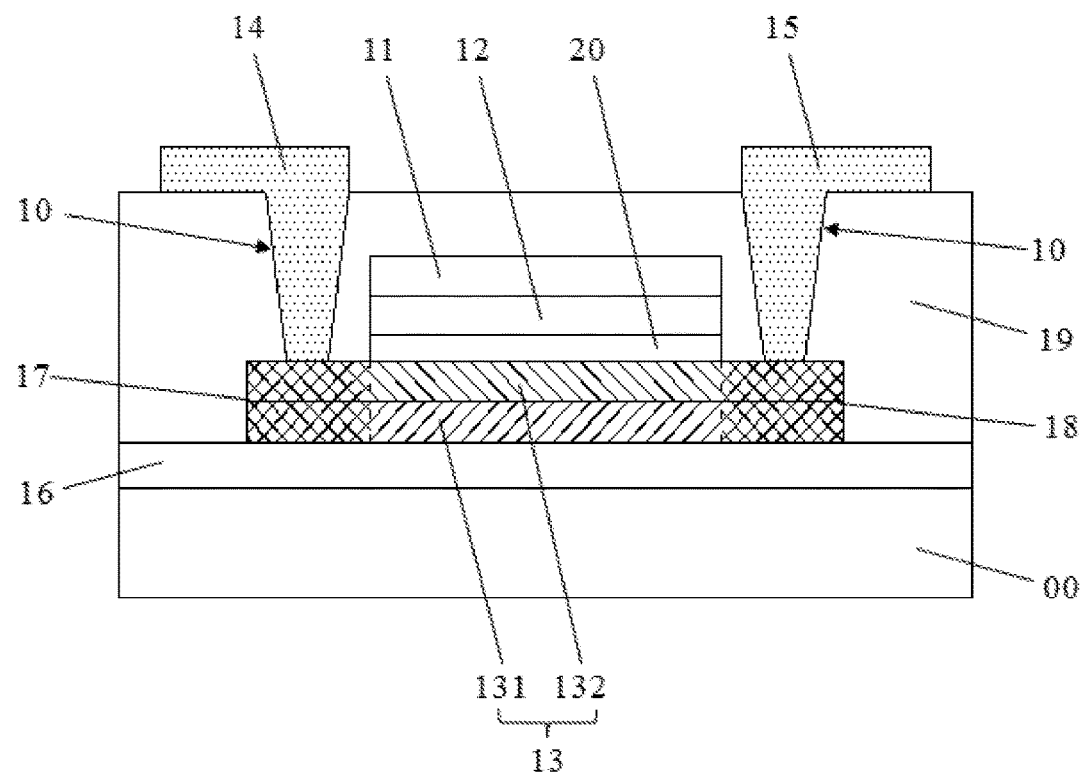
FIG. 1 is a schematic view of the TFT in accordance with one embodiment.

Referring to FIG. 1, a TFT 1 is formed on a substrate 00. The TFT 1 includes a gate electrode 11, a gate insulation layer 12, an active layer 13, a source electrode 14, and a drain electrode 15.

As shown in FIG. 1, the TFT 1 is a TFT of top-gate type, wherein the substrate 00 includes a buffer layer 16 formed thereon. The active layer 13 is formed on the buffer layer 16. The gate insulation layer 12 and the gate electrode 11 are formed on the active layer 13 in sequence. Two sides of the active layer 13 are respectively configured with a source connection portion 17 and a drain connection portion 18. Further, an insulation dielectric layer 19 is arranged on the gate electrode 11, and the insulation dielectric layer 19 covers the substrate 00, the source connection portion 17, and the drain connection portion 18. The source electrode 14 and the drain electrode 15 are formed on the insulation dielectric layer 19. The source electrode 14 connects to the source connection portion 17 via a through hole 10 configured within the insulation dielectric layer 19 such that the source electrode 14 connects to the active layer 13. The drain electrode 15 connects to the drain connection portion 18 via the through hole 10 configured within the insulation dielectric layer 19 so as to connect to the active layer 13, wherein the substrate 00 may be a glass substrate.

As shown in FIG. 1, the active layer 13 includes a first semiconductor layer 131 and a second semiconductor layer 132 stacked in turn. The first semiconductor layer 131 and the second semiconductor layer 132 are formed on the buffer layer 16 in turn. The first semiconductor layer 131 and the second semiconductor layer 132 are formed by IGZO, but a content of the In atom of the first semiconductor layer 131 is different from that of the second semiconductor layer 132. Specifically, the content of the In atom of the first semiconductor layer 131 is less than that of the second semiconductor layer 132. That is, the content of the In atom of the first semiconductor layer 131, i.e., In/(Ga+Zn), is smaller than 50%. Preferably, the content of the In atom of the first semiconductor layer 131 is in a range from 40 to 50%. In addition, the content of the In atom of the second semiconductor layer 132, i.e., In(Ga+Zn), of the second semiconductor layer 132 is greater than 55%. Preferably, the content of the In atom of the second semiconductor layer 132 is in a range from 55 to 60%.

In view of the above, two semiconductor layers made by IGZO are formed as the semiconductor body of the active layer. The IGZO semiconductor layer, i.e., the second semiconductor layer 132, having the greater content of the In atom is configured to be closer to the GI layer than the IGZO semiconductor layer having fewer content of the In atom. In this way, the semiconductor body of the active layer may be prevented from being bombarded by the ionomer so as to enhance the carrier mobility rate of the active layer. In addition, the IGZO semiconductor layer having fewer content of the In atom is configured to prevent the semiconductor body of the active layer from being transformed into the conductor so as to satisfy the demand toward the TFT characteristics. Thus, the carrier mobility rate of the semiconductor body of the active layer is enhanced as a whole, which enhances the stability of the component.

Further, as known, the IGZO semiconductor layer is sensitive to the conditions of the manufacturing process. A certain amount of H atom may exist in the air and in the following manufacturing process, and the H atom may affect the electrical performance of the IGZO semiconductor layer, which results in that the IGZO semiconductor layer may be transformed into the conductor. Due to the above reasons, as shown in FIG. 1, an oxygen protection layer 20 is configured between the second semiconductor layer 132 and the gate insulation layer 12. That is, the oxygen protection layer 20 is formed above the first semiconductor layer 131 and the second semiconductor layer 132, and other layers may be formed afterward. In this way, the electrical performance impact causing by the H atom toward the IGZO semiconductor layer may be decreased so as to enhance the performance of the components. Further, as the oxygen protection layer 20 is configured between the second semiconductor layer 132 and the gate insulation layer 12, the carrier of the first semiconductor layer 131 and the second semiconductor layer 132 are prevented from being captured by the defects of the gate insulation layer 12.

Further, in the embodiment, the source connection portion 17 and the drain connection portion 18 are integrally formed with the first semiconductor layer 131 and the second semiconductor layer 132. Referring to FIG. 1, the oxygen protection layer 20 covers a middle area of the active layer 13, and two sides of the oxygen protection layer 20 expose the active layer 13. The exposed first semiconductor layer 131 and the second semiconductor layer 132 of the active layer 13 are transformed into the conductor by applying ion injection process or plasma process. In this way, after being transformed into the conductor, one end of the active layer 13 is formed as the source connection portion 17, and the other end of the active layer 13 is formed as the drain connection portion 18. With respect to the ion injection process, the In atom are injected. With respect to the plasma process, the H ion or Ar ion may be adopted. The source connection portion 17, the drain connection portion 18, and the active layer 13, including the first semiconductor layer 131 and the second semiconductor layer 132, are on the same layer, and are integrally formed. In addition, the electrical conductivity of the source connection portion 17 and the drain connection portion 18 are good. Thus, when the source electrode 14 and the drain electrode 15 respectively connects to the active layer 13 via the source connection portion 17 and the drain connection portion 18, the contact resistance between the source electrode 14 and drain electrode 15 and the active layer 13 are decreased so as to enhance the performance of the component.

Figure 2:
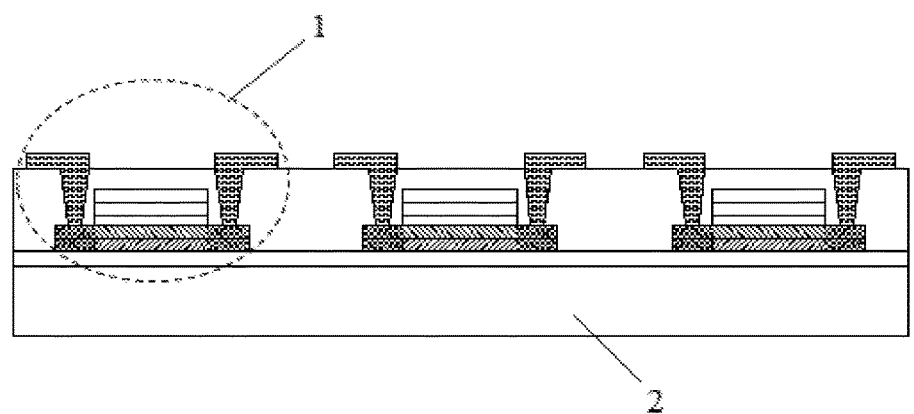
FIG. 2 is a schematic view of the TFT array substrate in accordance with one embodiment.

The present disclosure also relates to a TFT array substrate. As shown in FIG. 2, the TFT array substrate includes a glass substrate 2 and TFTs 1 on the glass substrate 2. It is to be noted that three TFTs are arranged on the glass substrate 2 as one example. The TFT 1 may be the above TFT 1. The TFT array substrate may be mainly adopted in LCD. Further, as the carrier mobility rate of the TFT 1 is higher and can satisfy the demand of OLED, and thus the TFT array substrate may be also adopted in OLED.

Figure 3:
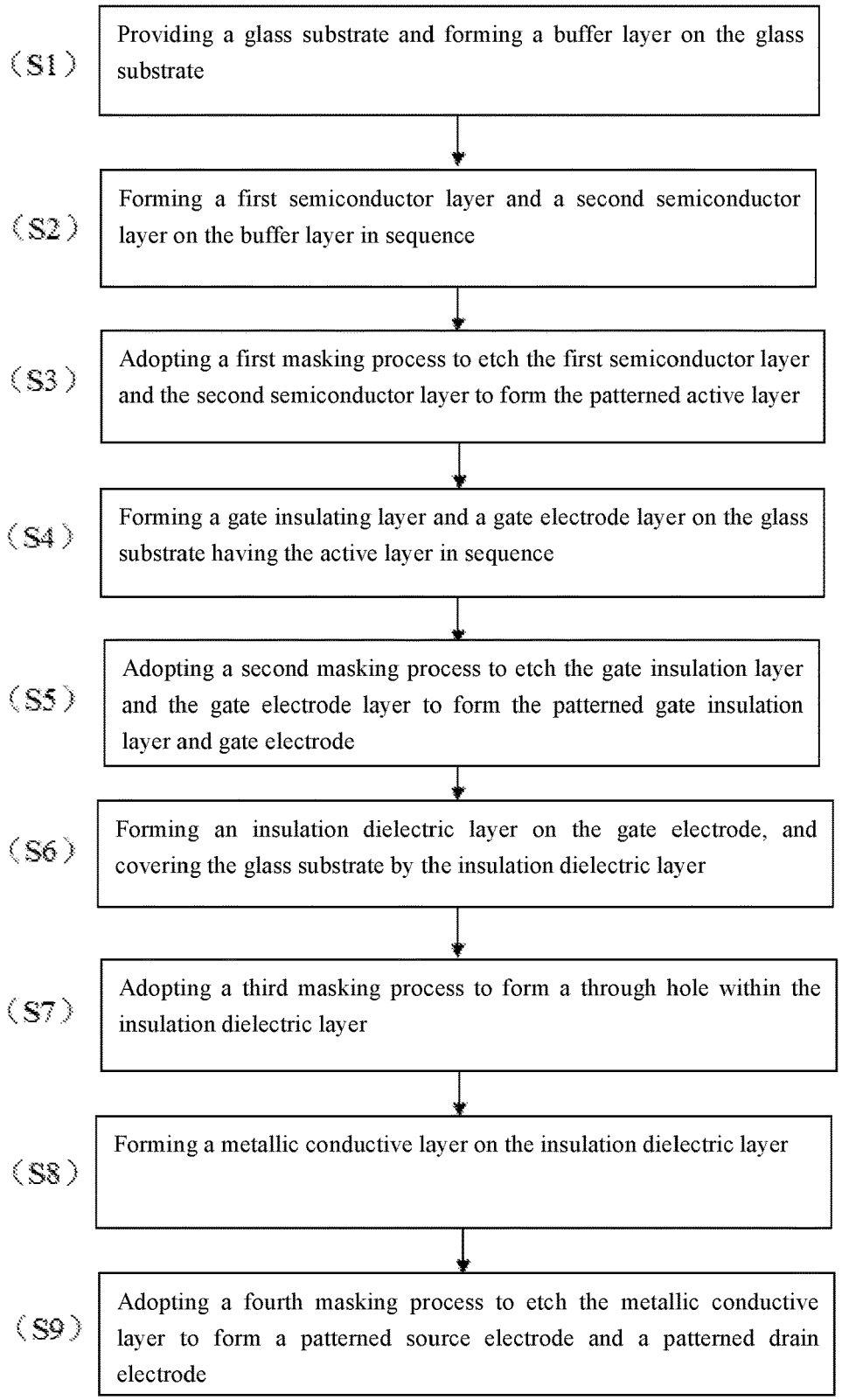
FIG. 3 is a flowchart illustrating the manufacturing method of the TFT array substrate in accordance with one embodiment.

Also referring to FIGS. 1 and 2, FIG. 3 is a flowchart illustrating the manufacturing method of the TFT array substrate in accordance with one embodiment. The method includes the following steps.

In step S1, providing a glass substrate 2, which is equivalent to the substrate 00 of FIG. 1, and forming a buffer layer 16 on the glass substrate 2. The buffer layer 16 may be formed by manufacturing processes, such as magnetron sputtering process, plasma enhanced chemical deposition process (PECVD), atomic deposition process, or solution method. The buffer layer 16 may be made by organic or inorganic insulation materials.

In step S2, forming a first semiconductor layer and a second semiconductor layer on the buffer layer 16 in sequence. The first semiconductor layer 131 may be made by the IGZO semiconductor material having fewer content of the In atom, and the second semiconductor layer may be made by the second semiconductor layer 132 having the greater content of the In atom. The first semiconductor layer and the second semiconductor layer 132 may be made by manufacturing processes, such as magnetron sputtering process, plasma enhanced chemical deposition process (PECVD), atomic deposition process, or solution method. The buffer layer 16 may be made by organic or inorganic insulation materials.

In step S3, adopting a first masking process to etch the first semiconductor layer 131 and the second semiconductor layer 132 to form the patterned active layer 13. The active layer 13 includes the first semiconductor layer 131 and the second semiconductor layer 132 stacked in turn. The first semiconductor layer 131 is made by etching the first semiconductor layer 131, and the second semiconductor layer 132 is made by etching the second semiconductor layer 132.

In step S4, forming a gate insulation layer and a gate electrode layer on the glass substrate 2 having the active layer 13. The gate insulation layer may be silicon oxide, and the gate electrode layer may be made by metallic conductive materials, wherein the gate insulation layer and the gate electrode layer may be made by manufacturing processes, such as magnetron sputtering process, plasma enhanced chemical deposition process (PECVD), atomic deposition process, or solution method. The buffer layer 16 may be made by organic or inorganic insulation materials.

In Step S5, adopting a second masking process to etch the gate insulation layer and the gate electrode layer to form the patterned gate insulation layer 12 and gate electrode 11, wherein the gate insulation layer 12 is formed by etching the gate insulation layer, and the gate electrode 11 is formed by etching the gate electrode layer.

In step S6, forming the insulation dielectric layer 19 on the gate electrode 11, and covering the glass substrate 2 by the insulation dielectric layer 19, wherein the insulation dielectric layer 19 may be made by silicon oxide, and the insulation dielectric layer 19 may be made by the manufacturing processes, such as magnetron sputtering process, plasma enhanced chemical deposition process (PECVD), atomic deposition process, or solution method.

In step S7, adopting a third masking process to form a through hole 10 within the insulation dielectric layer 19.

In step S8, forming a metallic conductive layer on the insulation dielectric layer 19. The metallic conductive layer may be made by manufacturing processes, such as magnetron sputtering process, plasma enhanced chemical deposition process (PECVD), atomic deposition process, or solution method.

In step S9, adopting a fourth masking process to etch the metallic conductive layer to form the patterned source electrode 14 and the drain electrode 15. The source electrode 14 and the drain electrode 15 respectively connects to the active layer 13 via the through hole 10 within the insulation dielectric layer 19.

In the above manufacturing processes, fourth masking processes are adopted to manufacture the TFT 1 on the glass substrate 2. Compared to the conventional process involving with four masking processes, the proposed manufacturing process only involves with fewer masking process so as to reduce the cost.

Each of the masking processes may include a mask, exposure, development, etching and peeling process, wherein the etching process includes dry etching and wet etching. The masking process may refer to the conventional ones, and thus are omitted hereinafter.

In addition, it is to be noted that, the TFT array substrate may include patterned structures, such as pixel electrodes, however, detailed descriptions regarding such structures are omitted for the reason that such structures are not closely related.

In the embodiment, in step S2, the oxygen protection layer 20 is formed on the second semiconductor layer. Specifically, when the second semiconductor layer is formed by the deposition process, $O_2$ and Ar are inputted to form the oxygen protection layer on the surface of the second semiconductor layer. After the first masking process, the oxygen protection layer 20 may be obtained on the second semiconductor layer 132.

Further, the step S5 further includes:

In step S51, adopting a top gate self-aligned process to perform the etching process to form the gate insulation layer 12 and the gate electrode 11. Two ends of the first semiconductor layer 131 and the second semiconductor layer 132 respectively extends from two ends of the gate insulation layer 12 and the gate electrode 11. During the formation of the gate insulation layer 12 and the gate electrode 11, the oxygen protection layer 20 is etched correspondingly, wherein only the oxygen protection layer 20 right below the gate insulation layer 12 is kept. That is, the oxygen protection layer 20 only covers the middle area of the active layer 13, and the active layer 13 is exposed via two ends of the oxygen protection layer 20.

In step S52, adopting the ion injection process or plasma bombard process to transform two ends of the first semiconductor layer 131 and the second semiconductor layer 132 to be the conductor. That is, the active layer 13 is exposed by two ends of the oxygen protection layer 20, wherein one end is formed as the source connection portion 17, and the other end is formed as the drain connection portion 18. With respect to the ion injection process, the In atom are injected. With respect to the plasma process, the H ion or Ar ion may be adopted. The source connection portion 17, the drain connection portion 18, and the active layer 13, including the first semiconductor layer 131 and the second semiconductor layer 132, are on the same layer, and are integrally formed. In addition, the electrical conductivity of the source connection portion 17 and the drain connection portion 18 are good. Thus, when the source electrode 14 and the drain electrode 15 respectively connects to the active layer 13 via the source connection portion 17 and the drain connection portion 18, the contact resistance between the source electrode 14 and drain electrode 15 and the active layer 13 are decreased so as to enhance the performance of the component.

In view of the above, two IGZO semiconductor layers are adopted as the semiconductor body of the active layer.

The IGZO semiconductor layer having the greater content of the In atom is configured to be closer to the GI layer than the IGZO semiconductor layer having fewer content of the In atom. In this way, the semiconductor body of the active layer may be prevented from being bombarded by the ionomer so as to enhance the carrier mobility rate of the active layer. In addition, the IGZO semiconductor layer having fewer content of the In atom is configured to prevent the semiconductor body of the active layer from being transformed into the conductor so as to satisfy the demand toward the TFT characteristics.

It should be understood that, although the possible use of the terms first, second, etc. are used to describe various components, but the components are not limited by these terms. These terms are only used to distinguish one element from another. For example, without departing from the scope of example embodiments, the first component may be named as a second component, similarly, the second component may be named as the first member.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . ." does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A thin film transistor (TFT), comprising:
   an active layer formed on a substrate, wherein the active layer comprises a first semiconductor layer and a second semiconductor layer stacked together, the first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%;
   wherein an oxygen protection layer covers the second semiconductor layer;
   wherein the TFT further comprises a gate electrode, a source electrode, and a drain electrode, wherein a buffer layer is formed on the substrate, the first semiconductor layer and the second semiconductor layer are formed on the buffer layer in sequence, a gate insulation layer and the gate electrode are formed on the active layer in sequence, an insulation dielectric layer is arranged on the gate electrode, and the insulation dielectric layer covers the substrate, the source electrode and the drain electrode are formed on the insulation dielectric layer, and the source electrode and the drain electrode respectively connects to the active layer via at least one through hole within the insulation dielectric layer;
     wherein the oxygen protection layer covers a middle area of the active layer, and the active layer is exposed by two sides of the oxygen protection layer; and
   the exposed first semiconductor layer and the second semiconductor layer of the active layer are transformed into conductors by applying an ion injection process or a plasma bombard process, wherein one end is formed as a source connection portion, and the other end is formed as a drain connection portion, the source electrode connects to the source connection portion via the through hole configured within the insulation dielectric layer, and the drain electrode connects to the drain connection portion via the through hole configured within the insulation dielectric layer.

2. The TFT as claimed in claim 1, wherein the first semiconductor layer is made by IGZO having the atomic ratio In/(Ga+Zn) in a range from 40 to 50%.

3. The TFT as claimed in claim 1, wherein the second semiconductor layer is made by IGZO having the atomic ratio In/(Ga+Zn) in a range from 55 to 60%.

4. A TFT array substrate, comprising:
   a glass substrate and a TFT arranged on the glass substrate, wherein the TFT comprises an active layer formed on a substrate, wherein the active layer comprises a first semiconductor layer and a second semiconductor layer stacked together, the first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%;
   wherein an oxygen protection layer covers the second semiconductor layer;
   wherein the TFT further comprises a gate electrode, a source electrode, and a drain electrode, wherein a buffer layer is formed on the substrate, the first semiconductor layer and the second semiconductor layer are formed on the buffer layer in sequence, a gate insulation layer and the gate electrode are formed on the active layer in sequence, an insulation dielectric layer is arranged on the gate electrode, and the insulation dielectric layer covers the substrate, the source electrode and the drain electrode are formed on the insulation dielectric layer, and the source electrode and the drain electrode respectively connects to the active layer via at least one through hole within the insulation dielectric layer;

wherein the oxygen protection layer covers a middle area of the active layer, and the active layer is exposed by two sides of the oxygen protection layer; and the exposed first semiconductor layer and the second semiconductor layer of the active layer are transformed into a conductor by applying an ion injection process or a plasma bombard process, wherein one end is formed as a source connection portion, and the other end is formed as a drain connection portion, the source electrode connects to the source connection portion via the through hole configured within the insulation dielectric layer, and the drain electrode connects to the drain connection portion via the through hole configured within the insulation dielectric layer.

5. The TFT array substrate as claimed in claim 4, wherein the first semiconductor layer is made by IGZO having the atomic ratio In/(Ga+Zn) in a range from 40 to 50%.

6. The TFT array substrate as claimed in claim 4, wherein the second semiconductor layer is made by IGZO having the atomic ratio In/(Ga+Zn) in a range from 55 to 60%.

7. A manufacturing method of TFT array substrates, comprising:
S1: providing a glass substrate and forming a buffer layer on the glass substrate;
S2: forming a first semiconductor layer and a second semiconductor layer on the buffer layer in sequence, wherein an active layer comprises the first semiconductor layer and the second semiconductor layer stacked together, the first semiconductor layer is made by Indium gallium zinc oxide (IGZO) having an atomic ratio In/(Ga+Zn) smaller than 50%, and the second semiconductor layer is made by IGZO having the atomic ratio In/(Ga+Zn) greater than 55%;
S3: adopting a first masking process to etch the first semiconductor layer and the second semiconductor layer to form the patterned active layer, the active layer comprises the first semiconductor layer and the second semiconductor layer stacked in sequence;
S4: forming a gate insulating layer and a gate electrode layer on the glass substrate having the active layer in sequence;
S5: adopting a second masking process to etch the gate insulation layer and the gate electrode layer to form the patterned gate insulation layer and gate electrode;
S6: forming an insulation dielectric layer on the gate electrode, and covering the glass substrate by the insulation dielectric layer;
S7: adopting a third masking process to form a through hole within the insulation dielectric layer;
S8: forming a metallic conductive layer on the insulation dielectric layer;
S9: adopting a fourth masking process to etch the metallic conductive layer to form a patterned source electrode and a patterned drain electrode, the source electrode and the drain electrode respectively connects to the active layer via the through hole within the insulation dielectric layer;

wherein the step S5 further comprises:
Step S51: adopting a top gate self-aligned process to perform an etching process to form the gate insulation layer and the gate electrode; and
Step S52: adopting an ion injection process or a plasma bombard process to transform two ends of the first semiconductor layer and the second semiconductor layer to be conductors, wherein one end is formed as a source connection portion, and the other end is formed as a drain connection portion.

8. The TFT array substrate as claimed in claim 7, wherein the first semiconductor layer is made by IGZO having the atomic ratio In/(Ga+Zn) in a range from 40 to 50%.

9. The TFT array substrate as claimed in claim 7, wherein the second semiconductor layer is made by IGZO having the atomic ratio In/(Ga+Zn) in a range from 55 to 60%.

10. The TFT array substrate as claimed in claim 7, wherein the step S2 further comprises covering the second semiconductor layer by an oxygen protection layer.

* * * * *